(12) United States Patent
Li et al.

(10) Patent No.: US 9,704,885 B2
(45) Date of Patent: Jul. 11, 2017

(54) PIXEL STRUCTURE, ARRAY SUBSTRATE AND DISPLAY DEVICE

(71) Applicant: BOE TECHNOLOGY GROUP CO., LTD., Beijing (CN)

(72) Inventors: Pan Li, Beijing (CN); Wenbo Li, Beijing (CN); Yong Qiao, Beijing (CN); Hongfei Cheng, Beijing (CN); Jianbo Xian, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/908,236

(22) PCT Filed: Apr. 24, 2015

(86) PCT No.: PCT/CN2015/077440
§ 371 (c)(1),
(2) Date: Jan. 28, 2016

(87) PCT Pub. No.: WO2016/110025
PCT Pub. Date: Jul. 14, 2016

(65) Prior Publication Data
US 2016/0336351 A1     Nov. 17, 2016

(30) Foreign Application Priority Data
Jan. 8, 2015   (CN) .................... 2015 2 0013468 U

(51) Int. Cl.
*H01L 29/10*   (2006.01)
*H01L 27/12*   (2006.01)
(Continued)

(52) U.S. Cl.
CPC ........ *H01L 27/1222* (2013.01); *G02F 1/1368* (2013.01); *G02F 1/134309* (2013.01);
(Continued)

(58) Field of Classification Search
None
See application file for complete search history.

(56) References Cited

U.S. PATENT DOCUMENTS

2007/0235733 A1   10/2007   Moriya
2008/0088783 A1    4/2008   Tai et al.
(Continued)

FOREIGN PATENT DOCUMENTS

CN     101051671 A    10/2007
CN     101359690 A     2/2009
(Continued)

OTHER PUBLICATIONS

English translation of CN101359690, 10 pgs, retrieved on Dec. 5, 2016 from Google Patents: https://patents.google.com/patent/CN101359690B/en.*

(Continued)

*Primary Examiner* — David E Graybill
(74) *Attorney, Agent, or Firm* — Collard & Roe, P.C.

(57) ABSTRACT

A pixel structure, an array substrate and a display device. The pixel substrate comprises a first pixel electrode and a second pixel electrode arranged in a first direction, and a thin film transistor (TFT) disposed between the first pixel electrode and the second pixel electrode. The TFT includes a comb-shaped source, a comb-shaped first drain and a comb-shaped second drain; and a channel region of the TFT is defined by the comb-shaped source respectively and the comb-shaped first drain and the comb-shaped second drain. The channel region has a greater ratio of width to length, thus improving the driving capability of the TFT for driving the first pixel electrode and the second pixel electrode.

20 Claims, 6 Drawing Sheets

(51) Int. Cl.
*G02F 1/1368* (2006.01)
*G02F 1/1343* (2006.01)
*H01L 29/417* (2006.01)
*H01L 29/786* (2006.01)
*G02F 1/1337* (2006.01)

(52) U.S. Cl.
CPC ........ H01L 27/12 (2013.01); H01L 29/41733 (2013.01); H01L 29/78696 (2013.01); *G02F 1/133707* (2013.01); *G02F 2001/134345* (2013.01); *G02F 2201/123* (2013.01); *G02F 2201/124* (2013.01); *G02F 2201/40* (2013.01)

(56) References Cited

U.S. PATENT DOCUMENTS

| | | | | |
|---|---|---|---|---|
| 2010/0097555 | A1* | 4/2010 | Huang | G02F 1/134309 349/139 |
| 2011/0084289 | A1* | 4/2011 | Tseng | G02F 1/136209 257/89 |
| 2011/0115691 | A1* | 5/2011 | Liu | G02F 1/136286 345/55 |
| 2012/0001189 | A1* | 1/2012 | Matsubara | G02F 1/136286 257/59 |
| 2012/0037908 | A1* | 2/2012 | Wu | H01L 27/1214 257/59 |
| 2012/0105784 | A1* | 5/2012 | Ho | G02F 1/136286 349/139 |
| 2012/0127067 | A1* | 5/2012 | Tseng | G02F 1/134336 345/87 |
| 2012/0262430 | A1* | 10/2012 | Ho | G02F 1/13624 345/204 |
| 2012/0293750 | A1* | 11/2012 | Yeh | G02F 1/133753 349/96 |
| 2013/0048999 | A1* | 2/2013 | Okazaki | G02F 1/1368 257/59 |
| 2013/0286304 | A1* | 10/2013 | Lin | G02B 27/2214 349/15 |
| 2014/0027778 | A1 | 1/2014 | Briere | |
| 2014/0203302 | A1* | 7/2014 | Cheng | G02F 1/134363 257/88 |
| 2014/0209932 | A1* | 7/2014 | Huang | H01L 27/124 257/88 |
| 2014/0347586 | A1* | 11/2014 | Wang | G02F 1/13394 349/43 |
| 2015/0070644 | A1* | 3/2015 | Lee | G02F 1/134309 349/142 |
| 2015/0268511 | A1* | 9/2015 | Hsu | G02F 1/133514 349/108 |
| 2016/0035903 | A1* | 2/2016 | Okachi | H01L 29/78603 257/66 |
| 2016/0086976 | A1* | 3/2016 | Dong | H01L 27/124 257/59 |
| 2016/0252791 | A1* | 9/2016 | Chai | G02F 1/1362 |
| 2016/0336351 | A1* | 11/2016 | Li | G02F 1/1343 |

FOREIGN PATENT DOCUMENTS

| | | |
|---|---|---|
| CN | 104133332 A | 11/2014 |
| CN | 204065626 U | 12/2014 |

OTHER PUBLICATIONS

International Search Report of PCT/CN2015/077440 in Chinese, mailed Sep. 25, 2015 with English translation.
Written Opinion of the International Searching Authority of PCT/CN2015/077440 in Chinese, mailed Sep. 25, 2015 with English translation.

* cited by examiner

PIXEL STRUCTURE, ARRAY SUBSTRATE AND DISPLAY DEVICE

CROSS REFERENCE TO RELATED APPLICATIONS

This application is the National Stage of PCT/CN2015/077440 filed on Apr. 24, 2015, which claims priority under 35 U.S.C. §119 of Chinese Application No. 201520013468.4 filed on Jan. 8, 2015, the disclosure of which is incorporated by reference.

FIELD

The present disclosure relates to a pixel structure, an array substrate and a display device.

BACKGROUND

Thin film transistor liquid crystal displays (TFT-LCD) having characteristics of thin thickness, low power consumption, and no radiation, have been developing rapidly in recent years, so that a dominant position in the current market of flat panel display has been occupied. Currently, TFT-LCDs have been applied widely on products of various sizes, almost covering a majority of electronics in information society now. Examples of TFT-LCDs applied on products of larger size are LCD televisions and high-definition digital televisions.

For the LCD televisions, since area of a sub-pixel unit thereof is relatively large, a TFT on an array substrate is required to have a strong driving capability. Conventional pixel structures can not meet the requirements.

SUMMARY

Embodiments of the present disclosure provide a pixel structure, an array substrate and a display device, solving the issue of lacking driving capability of the TFT of the sub-pixel unit of the liquid crystal television in the art.

Embodiments of the present disclosure provide a pixel structure, comprising a first pixel electrode and a second pixel electrode arranged along a first direction, and a thin film transistor (TFT) disposed between the first pixel electrode and the second pixel electrode. The TFT includes a source, a first drain and a second drain; the source includes a comb-shaped first source and a comb-shaped second source arranged along a second direction different from the first direction and interconnected; comb teeth of the first source extend to the first pixel electrode, comb teeth of the second source extend to the second pixel electrode; the first drain and the second drain are comb-shaped, comb handle of the first drain are connected to the first pixel electrode, comb teeth of the first drain and comb teeth of the first source are interdigitally disposed, comb handle of the second drain are connected to the second pixel, comb teeth of the second drain and comb teeth of the second source are interdigitally disposed.

In the embodiments of the present disclosure, the TFT includes the comb-shaped source, the comb-shaped first drain and the comb-shaped second drain, the source including the first source and the second source, and extending directions of the comb teeth of the source and extending directions of the comb teeth of the second source are contrary, channel regions of the TFT are defined by the first source and the first drain, and the second source and the second drain, respectively, the channel regions have a greater aspect ratio, thus improving the driving capability of the TFT for driving the first pixel electrode and the second pixel electrode.

In one example, the first source and the second source are connected by a common comb tooth. In the embodiments of the present disclosure, the first source and the second source are connected by the common comb tooth, which makes structures more compact, space occupation reduced.

In one example, a comb handle connecting the comb teeth of the first source and a comb handle connecting the comb teeth of the second source are respectively band-shaped electrodes extending along the second direction, and the comb handle of the first source is close to the second pixel electrode, and the comb handle of the second source is close to the first pixel electrode. In the embodiments of the present disclosure, the comb handle of the first source and the comb handle of the second source are provided so that design of the length of the comb teeth is more flexible.

In one example, the comb handle of the first source and the comb handle of the second source are parallel, the comb teeth of the first source are perpendicular to the comb handle of the first source, and the comb teeth of the second source are perpendicular to the comb handle of the second source.

In one example, the comb teeth of the first source and the comb teeth of the first drain are parallel to each other, the comb teeth of the second source and the comb teeth of the second drain are parallel to each other.

In one example, distances between each of the comb teeth of the first source and two adjacent comb teeth of the first drain are equal, and distances between each of the comb teeth of the second source and two adjacent comb teeth of the second drain are equal.

In one example, the gate of the TFT is disposed above or below a layer which the source, the first drain and the second drain are located on.

In one example, a width of the gate in the first direction is greater than the length of the comb teeth of the first source and the comb teeth of the second source in the first direction.

In one example, a width of an active layer in the first direction is less than or equal to a width of the gate in the first direction.

In one example, the comb teeth of the first source and the comb handle of the first source are perpendicular to each other, and the comb teeth of the second source and the comb handle of the second source are perpendicular to each other, and the comb teeth of the first drain and the comb handle of the first drain are perpendicular to each other, and the comb teeth of the second drain and the comb handle of the second drain are perpendicular to each other.

The embodiments of the present disclosure provide an array substrate, comprising an array of pixel units formed on a substrate, each of the pixel units has the pixel structure provided by the embodiments above.

In one example, a gate line is disposed between the first pixel electrodes and the second pixel electrodes of the pixel units belonging to a same row, which is connected to gates of the pixel units in the row, and the comb handle of the first source and the comb handle of the second source of each of the pixel units in the row are parallel to the gate line, and the comb teeth of the first source, the second source, the first drain and the second drain are perpendicular to the gate line.

The embodiments of the present disclosure provide a display device, comprising the array substrate provided by the embodiments above.

According to the embodiments of the present disclosure, the TFT includes the comb-shaped source, the comb-shaped first drain and the comb-shaped second drain, and the source including the first source and the second source, and extending directions of comb teeth of the first source and extending directions of comb teeth of the second source are contrary. A channel region of the TFT is defined by the first source and the first drain, and the second source and the second drain, respectively. The channel region has a greater aspect ratio, thus improving driving capability of the TFT for driving the first pixel electrode and the second pixel electrode.

BRIEF DESCRIPTION OF THE DRAWINGS

In order to explain the technical solution in the embodiments of the present disclosure more clearly, the accompanying drawings needed to be used in the embodiments will be briefly introduced below. It is obvious that the drawings described below are only some embodiments of the present disclosure, and other drawings can also be obtained based on these drawings for those skilled in the art without any inventive work.

DETAILED DESCRIPTION

Figure 1:
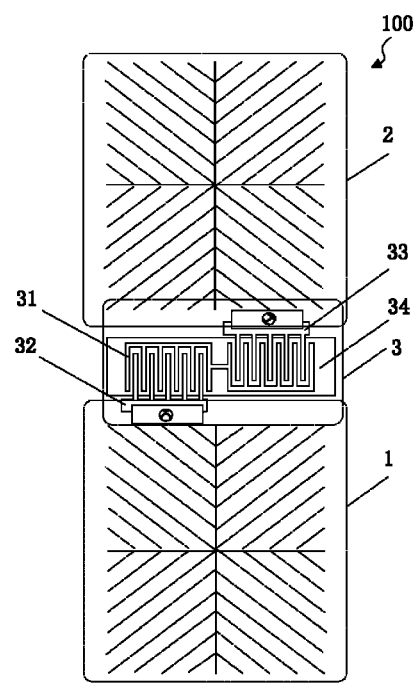
FIG. 1 is a schematic view of a pixel structure provided by embodiments of the present disclosure.

The technical solution of the embodiments of the present disclosure will be described clearly and fully in connection with the drawings of the embodiments of the present disclosure. It is obvious that the described embodiments are just a part but not all of the embodiments of the present disclosure. Based on the described embodiments of the present disclosure, those skilled in the art can obtain all other embodiments without any inventive work, which all fall into the scope of the claimed disclosure.

Unless otherwise defined, technical terms or scientific terms used herein shall have a common meaning known by those skilled in the art of the present disclosure. Terms and expressions such as "first", "second" and the like used in the description and claims of the patent application of the present disclosure do not denote any sequence, quantity or importance, but distinguish different components. Likewise, words such as "a", "an" and the like do not denote quantitative restrictions, but denote the presence of at least one. Words such as "connected", "connecting" and the like are not restricted to physical or mechanical connections, but can include electrical connections, regardless of direct or indirect connections. Words such as "up", "below", "left", "right", etc., are only used to denote the relative positional relationship. Upon the absolute position of the described object changes, the relative positional relationship change correspondingly. Thicknesses and shapes of various layers of films in the drawings do not reflect the true scale, which are just for purposes of illustrating schematically the contents of the present disclosure.

Figure 2:
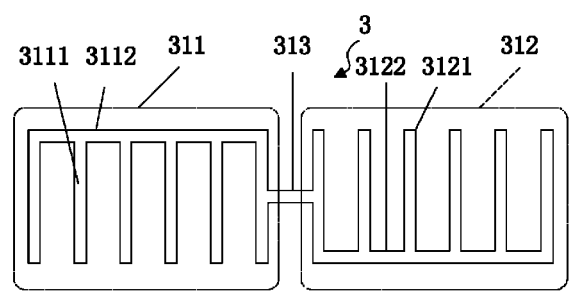
FIG. 2 is an enlarged schematic view of sources in the pixel structure shown in FIG. 1.

Referring to FIGS. 1 and 2, embodiments of the present disclosure provide a pixel structure 100, which includes a first pixel electrode 1 and a second pixel electrode 2 arranged along a first direction (for example, a column direction shown in FIG. 2), and a thin film transistor (TFT) 3 disposed between the first pixel electrode 1 and the second pixel electrode 2. The TFT 3 includes a source-drain metal layer (not marked in FIG. 1), a gate 34 disposed above or below the source-drain metal layer, and an active layer (not shown) disposed between the gate 34 and the source-drain metal layer. The source-drain metal layer includes a source 31, a first drain 32 and a second drain 33 which are insulated from each other.

Figure 3:
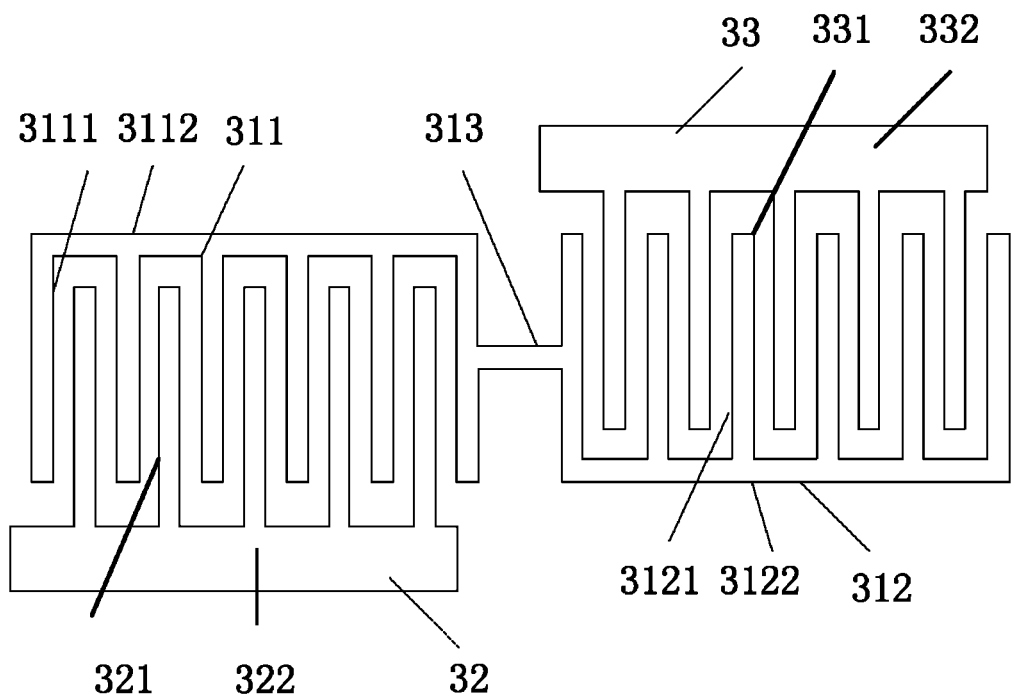
FIG. 3 is an enlarged schematic view of sources, a first drain and a second drain in the pixel structure shown in FIG. 1.

As shown in FIG. 2, the source 31 includes a comb-shaped first source 311 and a comb-shaped second source 312 arranged along a second direction (for example, a row direction shown in FIG. 2, the row direction and the column direction are preferably substantially perpendicular) different from the first direction and interconnected, and extending directions of comb teeth of the source 311 and extending directions of comb teeth of the second source 312 are contrary. The comb teeth 3111 of the first source 311 extend towards the first pixel electrode 1, and the comb teeth 3121 of the second source 312 extend towards the second pixel electrode 2. Correspondingly, as shown in FIG. 3, the first drain 32 and the second drain 33 are comb-shaped, the first drain 32 is connected to the first pixel electrode, comb teeth 321 of the first drain 32 and the comb teeth 3111 of the first source 311 are interdigitally disposed, the second drain 33 is connected to the second pixel electrode 2, comb teeth 331 of the second drain 33 and the comb teeth 3121 of the second source 312 are interdigitally disposed.

It should be noted that, the comb teeth of the first source 311, the second source 312, the first drain 32 and the second drain 33 can be multiple, for example, two comb teeth, three comb teeth, four comb teeth, . . . , N comb teeth, where N is a natural number. Meanwhile, number of the comb teeth of the first source 311, the second source 312, the first drain 32 and the second drain 33 can be the same or different. For example, the first source 311 includes three comb teeth 3111, and the first drain 32 includes two comb teeth 321; also for example, the first source 311 includes six comb teeth 3111, and the first drain 32 includes seven comb teeth 321; and also for example, the first source 311 includes five comb teeth 3111, and the first drain 32 includes five comb teeth 321. Therefore, FIGS. 1 and 2 are only for illustrating the present embodiments, the present disclosure is not limited thereto.

Further, the gate 34 can be located above or below the source-drain metal layer. In the top gate type TFT, the gate 34 is located above the source-drain metal layer; and in the bottom gate type TFT, the gate 34 is located below the source-drain metal layer. The drawings of the present disclosure are only for illustrating without being limited to one structure.

Figure 4:
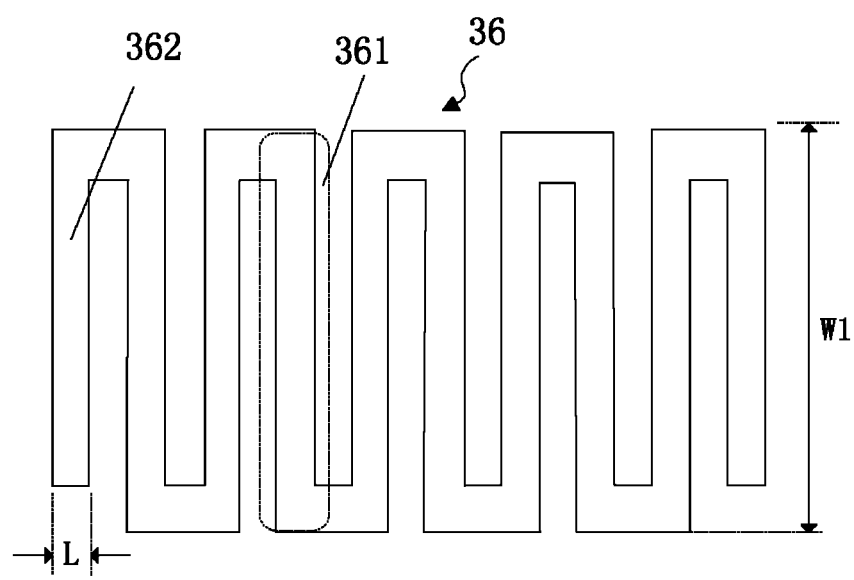
FIG. 4 is an enlarged schematic view of a channel region defined by a first source, a first drain, a second source and a second drain in FIG. 3.

FIG. 4 shows a channel region 36 defined by the first source 311 and the first drain 32, or by the second source 312 and the second drain 33. As shown in FIG. 4, the channel region 36 is a square wave. The square wave includes a plurality of middle sections 361 (for example, n middle sections, where n is a natural number greater than or equal to 2) and two end sections 362. A cross-sectional width of the square wave is marked as L, and a length of a single middle section 361 is marked as W1. The length of the channel region 36 is a distance between a source and a drain opposite to the source, namely a cross-sectional width L of the square wave. And the width W of the channel region 36 is a total length of the square wave. For ease of calculation, the total length of the square wave can be simply calculated as a total length of the middle sections 361 of the channel region 36. For example, W≈W1*n, wherein W1 is a length of a single middle section 361, and n is the number of the middle sections. Therefore, an aspect ratio W/L of the TFT 3 can be increased within a limited region, thereby improving driving capability of the TFT 3. Further, according to the present disclosure, in the case that the driving capability of the TFT is constant, since the aspect ratio of the channel region 36 of the TFT 3 defined by the first source 311 and the first drain 32, or the second source 312 and the second drain 33 is changed, the length W1 of the middle section of the channel region 36 is reduced. This also means that the width of the gate 34 corresponding to the channel region in the column direction can be reduced. This can reduce the area occupied by electrodes in the pixel structure 10, so as to provide more space for displaying, namely increasing aperture ratio of the pixel.

In the embodiments of the present disclosure, the TFT 3 includes the comb-shaped source 31, the first drain 32 and the second drain 33. The source 31 includes the first source 311 and the second source 312, and the extending directions of comb teeth of the source 311 and the extending directions of comb teeth of the second source 312 are contrary. The first source 311 and the first drain 32, the second source 312 and the second drain 33 respectively define the channel region of the TFT 3, and the channel region has a greater aspect ratio, thereby improving the driving capability of the TFT 3 for driving the first pixel electrode 1 and the second pixel electrode 2.

Figure 5:
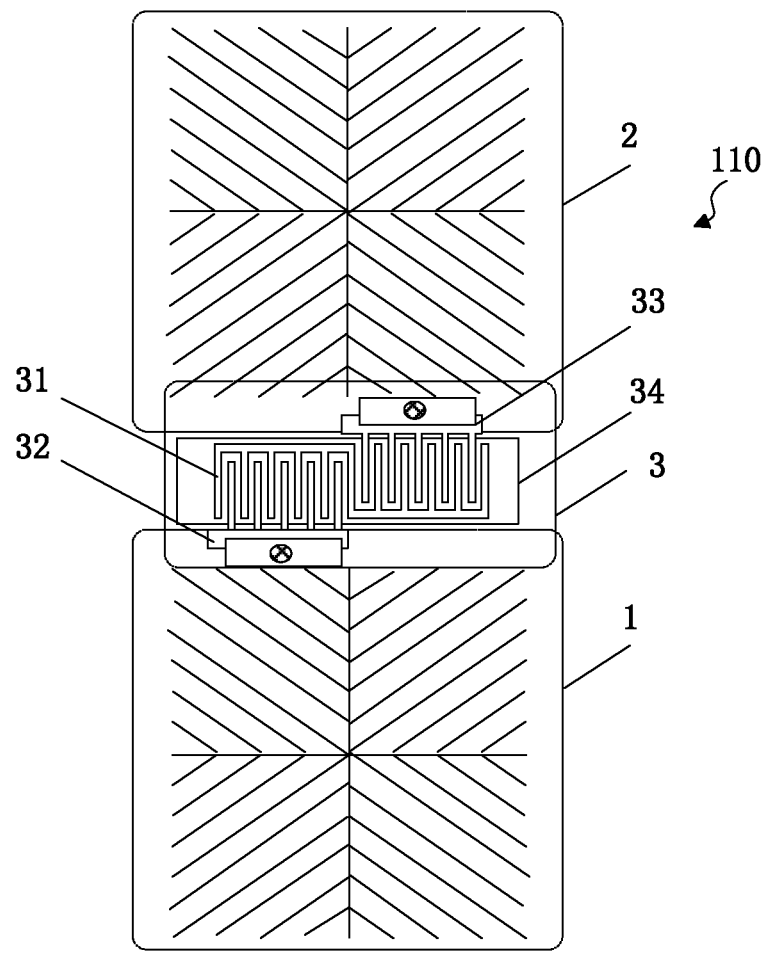
FIG. 5 is a schematic view of another pixel structure provided by embodiments of the present disclosure.
Figure 6:
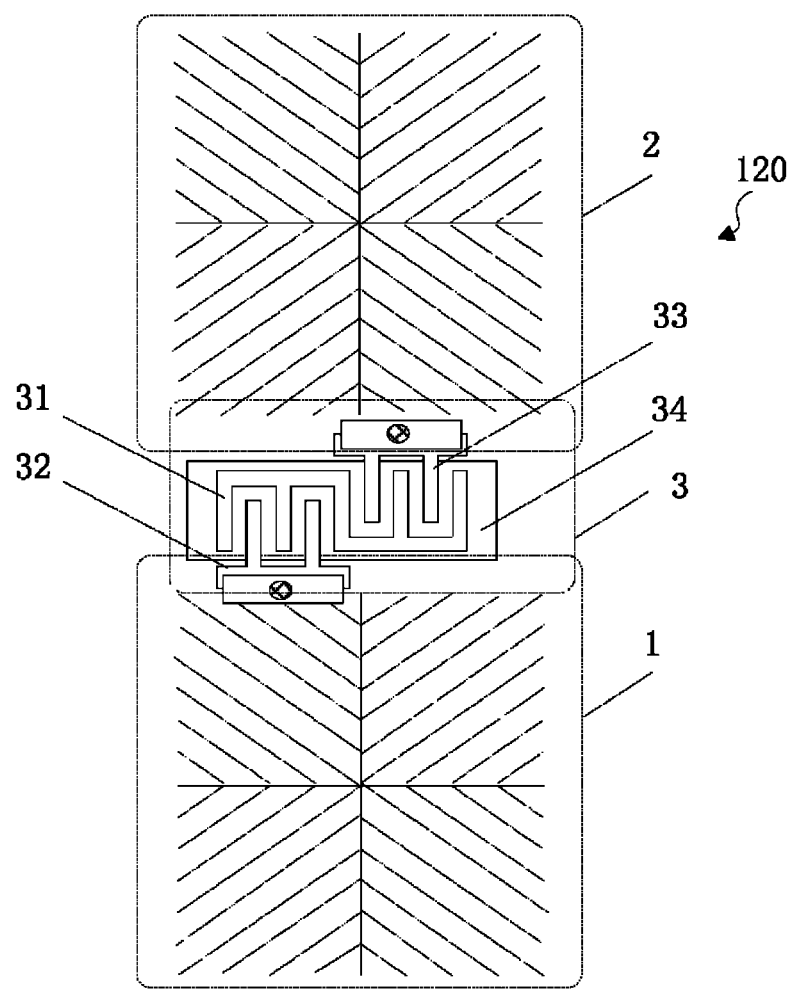
FIG. 6 is a schematic view of another pixel structure provided by embodiments of the present disclosure.

The first source 311 and the second source 312 can be electrically connected by a connection component 313, as shown in FIGS. 2 and 3. The first source 311 and the second source 312 can be formed as an integrated structure, for example, through a common comb tooth, as shown in FIGS. 5 and 6. In a pixel structure 110 shown in FIG. 5 and a pixel structure 120 shown in FIG. 6, same components are denoted by identical reference numbers. The first source 311 and the second source 312 can respectively have a plurality of middle comb teeth, as shown in FIG. 5, or one comb tooth, thus the source 31 appears a reverse double "M" shape, as shown in FIG. 6. In the above embodiments of the present disclosure, the first source 311 and the second source 312 are connected by the common comb tooth, which makes the structure more compact, reducing the space occupied.

In one example, a comb handle 3112 connecting to the comb teeth 3111 of the first source 311 and a comb handle 3122 connecting to the comb teeth 3121 of the second source 312 are band-shaped electrodes respectively extending along the row direction, and the comb handle 3112 of the first source 311 is close to the second pixel electrode 2, and the comb handle 3122 of the second source 312 is close to the first pixel electrode 1. In the embodiments of the present disclosure, the comb handle 3112 of the first source 311 and the comb handle 3122 of the second source 312 are provided so that design of the length of the comb teeth is more flexible.

In one example, the comb handle of the first source 311 and the comb handle of the second source 312 are parallel.

In one example, the comb teeth of the first source 311, the second source 312, the first drain 32 and the second drain 33 are parallel to each other. In the embodiments of the present disclosure, the comb teeth of the first source 311, the second source 312, the first drain 32 and the second drain 33 are parallel to each other, which facilitates to build an interdigital structure.

In one example, distances between each of the comb teeth 3111 of the first source 311 and two adjacent comb teeth 321 of the first drain 32 are equal, and distances between each of the comb teeth 3121 of the second source 312 and two adjacent comb teeth 331 of the second drain 33 are equal. In the embodiments of the present disclosure, since distances between the comb teeth forming the interdigital structure are equal, the process of constructing the interdigital structure is simple and highly reliable, and the lengths L of respective portions of the channel region defined by the first source 311 and the corresponding drain, and the second source 312 and the corresponding drain are equal, thus performance of the TFT is more uniform.

In one example, the comb teeth 3111 of the first source 311 do not extend crossing the extension line of the comb handle 3122 of the second source 312, and the comb teeth 3121 of the second source 312 do not extend crossing the extension line of the comb handle 3112 of the first source 311. Thus the aperture ratio of the pixel structure is increased. In one example, the width of the gate 34 in the extension direction of the comb teeth of the source 31 is respectively greater than the length of the comb teeth 3111 of the first source 311 and the length of the comb teeth 3121 of the second source 312, therefore the effective channel region 36 is formed by the gate 34 with the first source 311, the second source 312, the first drain 32 and the second drain 33, and the active layer.

In one example, the width of the active layer in the column direction is less than or equal to the width of the gate 34 in the column direction.

In one example, the comb teeth 3111 of the first source 311 and the comb handle 3112 of the first source 311 are perpendicular to each other, and the comb teeth 3121 of the second source 312 and the comb handle 3122 of the second source 312 are perpendicular to each other, and the comb teeth 321 of the first drain 32 and the comb handle 322 of the first drain 32 are perpendicular to each other, and the comb teeth 331 of the second drain 33 and the comb handle 332 of the second drain 33 are perpendicular to each other. In the embodiments of the present disclosure, the comb teeth and the comb handles of the first source 311, the second source 312, the first drain 32 and the second drain 33 are perpendicular, facilitating to build the interdigital structure.

The embodiments of the present disclosure have the following advantageous effects. The TFT 3 includes the comb-shaped source 31, the first drain 32 and the second drain 33. The source 31 includes the comb-shaped first source 311 and the second source 312, the extending directions of comb teeth of the source 311 and the extending directions of comb teeth of the second source 312 are contrary. The first source 311 and the first drain 32, the second source 312 and the second drain 33 respectively define the channel region of the TFT 3, and the channel region has a greater aspect ratio, thereby improving the driving capability of the TFT 3 for driving the first pixel electrode 1 and the second pixel electrode 2. Further, in the case that the driving capability of the TFT is constant, since the aspect ratio of the channel region 36 of the TFT 3 defined by the first source 311 and the first drain 32, or the second source 312 and the second drain 33 is changed, the length W1 of the middle section of the channel region 36 can be reduced. It also means that the width of the gate 34 in the column direction can be reduced so as to provide more display spaces for the pixel, namely increasing the aperture ratio of the pixel.

Figure 7:
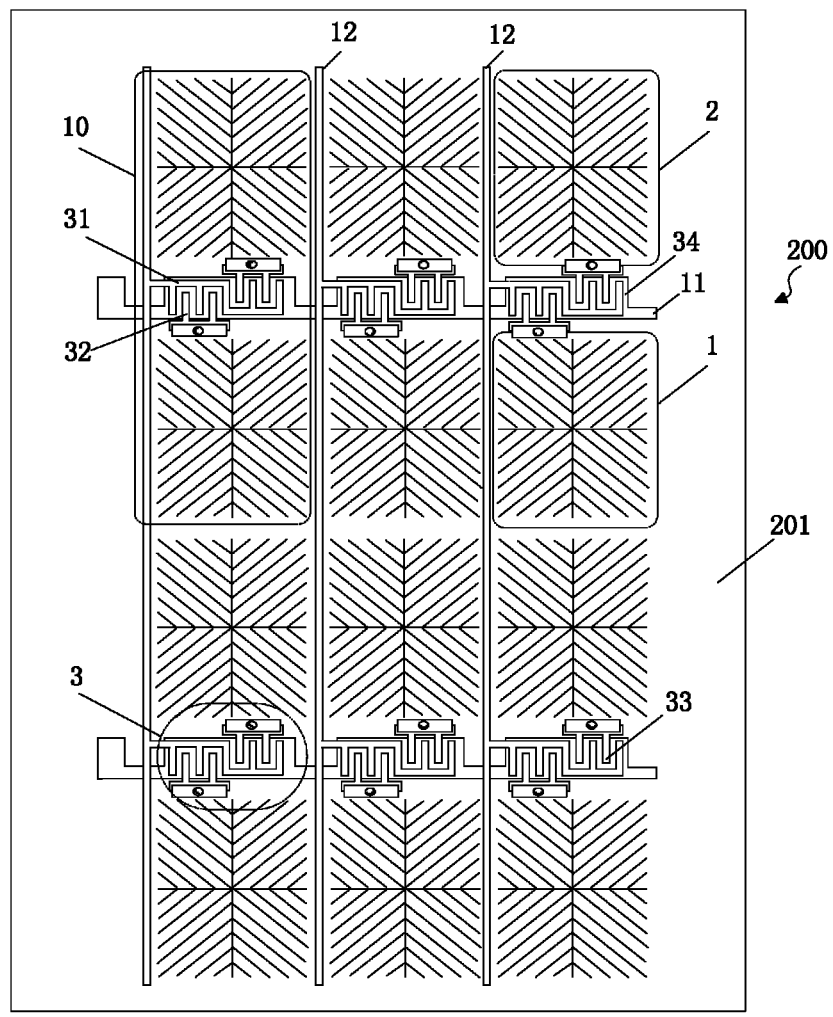
FIG. 7 is a structural schematic view of an array substrate structure provided by embodiments of the present disclosure and FIG. 8 is a structural schematic view of a display device provided by embodiments of the present disclosure.

Referring to FIG. 7, embodiments of the present disclosure provide an array substrate 200, including an array of pixel units 10 formed on a substrate 201. Each of the pixel units 10 has the pixel structure 100, 110 or 120 provided by the embodiments above.

In one example, a gate line 11 is disposed between first pixel electrodes 1 and second pixel electrodes 2 of the pixel units 10 belonging to a same row. The gate line 11 is connected to the gates 34 of the pixel units in the row. And a data line 12 is disposed between the pixel units 10 in two adjacent columns. It should be noted that, the present embodiments illustrates one data line 12 being disposed between the pixel units 10 in two adjacent columns, but the present disclosure is not limited thereto.

The comb handle 3112 of the first source 311 and the comb handle 3122 of the second source 312 of the pixel unit 10 in the row as shown in FIG. 2 or FIG. 3 are parallel to the gate line 11, and each of the comb teeth of the first source 311, the second source 312, the first drain 32 and the second drain 33 is perpendicular to the gate line 11.

The embodiments of the present disclosure have the following advantageous effects. The TFT includes the comb-shaped source, the first drain and the second drain. The source includes the comb-shaped first source and the second source, the extending directions of comb teeth of the source and the extending directions of comb teeth of the second source are contrary. The first source and the first drain, the second source and the second drain respectively define the channel region of the TFT, and the channel region has a greater aspect ratio, thereby improving the driving capability of the TFT for driving the first pixel electrode and the second pixel electrode. Further, in the case that the driving capability of the TFT is constant, since the aspect ratio of the channel region of the TFT defined by the first source and the first drain or the second source and the second drain is changed, the length of the middle section of the channel region can be reduced. It also means that the width of the gate in the column direction can be reduced so as to provide more display spaces for the pixel, namely increasing the aperture ratio of the pixel.

Figure 8:
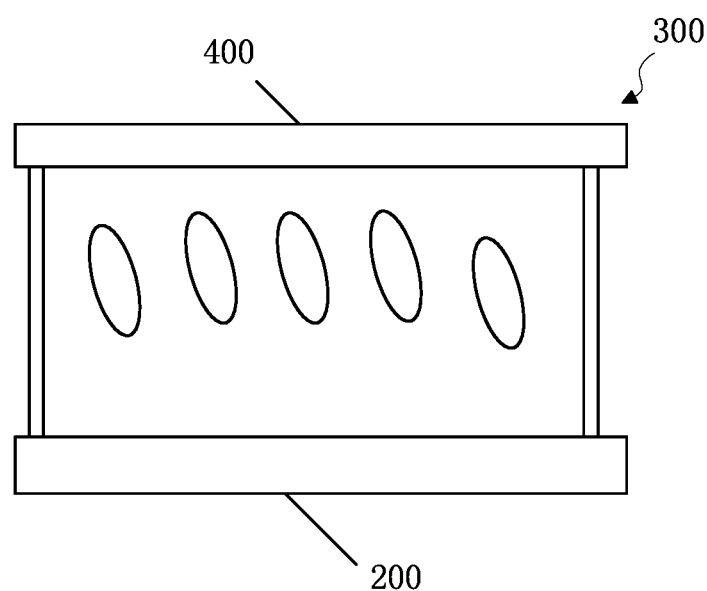

The embodiments of the present disclosure provide a display device 300 including the array substrate 200 provided by the embodiments above and a color film substrate 400, as illustrated in FIG. 8.

The embodiments of the present disclosure have the following advantageous effects. The TFT includes the comb-shaped source, the first drain and the second drain. The source includes the comb-shaped first source and the second source, the extending directions of comb teeth of the source and the extending directions of comb teeth of the second source are contrary. The first source and the first drain, the second source and the second drain respectively define the channel region of the TFT, and the channel region has a greater aspect ratio, thereby improving the driving capability of the TFT for driving the first pixel electrode and the second pixel electrode. Further, in the case that the driving capability of the TFT is constant, since the aspect ratio of the channel region of the TFT defined by the first source and the first drain or the second source and the second drain is changed, the length of the middle section of the channel region can be reduced. It also means that the width of the gate in the column direction can be reduced so as to provide more display spaces for the pixel, namely increasing the aperture ratio of the pixel. The above embodiments are only for illustrating the present disclosure, and not intended to limit the present disclosure.

Those skilled in the art can make various variations and modifications without departing from the spirit and scope of the present disclosure, so all equivalent technical solutions also fall into the scope of the present disclosure. It is intended that the scope of the present disclosure should be defined by the claims appended.

What is claimed is:

1. A pixel structure, comprising a first pixel electrode and a second pixel electrode arranged along a first direction, and a thin film transistor (TFT) disposed between the first pixel electrode and the second pixel electrode;

the TFT including a source, a first drain and a second drain; the source including a comb-shaped first source and a comb-shaped second source arranged along a second direction different from the first direction and interconnected; the first drain and the second drain are comb-shaped, and comb teeth of the first drain and comb teeth of the first source are interdigitally disposed, and comb teeth of the second drain and comb teeth of the second source are interdigitally disposed.

2. The pixel structure of claim 1, wherein, the comb teeth of the first source extend towards the first pixel electrode, and the comb teeth of the second source extend towards the second pixel electrode; the comb teeth of the first drain are connected to the first pixel electrode and extend towards the second pixel electrode, and the comb teeth of the second drain are connected to the second pixel electrode and extend towards the first pixel electrode.

3. The pixel structure of claim 1, wherein, the first source and the second source are connected by a common comb tooth.

4. The pixel structure of claim 1, wherein, a comb handle connecting the comb teeth of the first source and a comb handle connecting the comb teeth of the second source are band-shaped electrodes respectively extending along the second direction, and the comb handle of the first source is close to the second pixel electrode than the first pixel electrode, and the comb handle of the second source is close to the first pixel electrode than the second pixel electrode.

5. The pixel structure of claim 4, wherein, the comb handle of the first source and the comb handle of the second source are parallel.

6. The pixel structure of claim 1, wherein, the comb teeth of the first source and the comb teeth of the first drain are parallel to each other, and the comb teeth of the second source and the comb teeth of the second drain are parallel to each other.

7. The pixel structure of claim 6, wherein, distances between each of the comb teeth of the first source and two adjacent comb teeth of the first drain are equal, and distances between each of the comb teeth of the second source and two adjacent comb teeth of the second drain are equal.

8. The pixel structure of claim 1, wherein, a gate of the TFT is disposed above or below a layer where the source, the first drain and the second drain are located.

9. The pixel structure of claim 1, wherein, a width of the gate in the first direction is greater than a length of the comb teeth of the first source and the comb teeth of the second source in the first direction.

10. The pixel structure of claim 1, wherein, a width of an active layer in the first direction is less than or equal to a width of the gate in the first direction.

11. The pixel structure of claim 4, wherein, the comb teeth of the first source and the comb handle of the first source are perpendicular to each other, and the comb teeth of the second source and the comb handle of the second source are perpendicular to each other, and the comb teeth of the first drain and a comb handle of the first drain are perpendicular to each other, and the comb teeth of the second drain and a comb handle of the second drain are perpendicular to each other.

12. An array substrate, comprising:
an array of pixel units formed on a substrate, wherein, each of the pixel units comprises the following pixel structure:
  a) a first pixel electrode and a second pixel electrode arranged along a first direction, and a thin film transistor (TFT) disposed between the first pixel electrode and the second pixel electrode;
  b) the TFT including a source, a first drain and a second drain; the source including a comb-shaped first source and a comb-shaped second source arranged along a second direction different from the first direction and interconnected; the first drain and the second drain are comb-shaped, and comb teeth of the first drain and comb teeth of the first source are interdigitally disposed, and comb teeth of the second drain and comb teeth of the second source are interdigitally disposed;
  wherein, a comb handle connecting the comb teeth of the first source and a comb handle connecting the comb teeth of the second source are band-shaped electrodes respectively extending along the second direction, and the comb handle of the first source is close to the second pixel electrode than the first pixel electrode, and the comb handle of the second source is close to the first pixel electrode than the second pixel electrode.

13. The array substrate of claim 12, wherein, a gate line is disposed between the first pixel electrode and the second pixel electrode of the pixel unit belonging to a same row, the gate line is connected to the gate of the pixel unit in the same row, and the comb handle of the first source and the comb handle of the second source of the pixel unit in the same row are parallel to the gate line, and the comb teeth of the first source, the second source, the first drain and the second drain are perpendicular to the gate line.

14. A display device, comprising:
  a) an array substrate, comprising an array of pixel units formed on a substrate, wherein, each of the pixel units comprises the following pixel structure comprising:
    i) a first pixel electrode and a second pixel electrode arranged along a first direction, and a thin film transistor (TFT) disposed between the first pixel electrode and the second pixel electrode;
    ii) the TFT comprises a source, a first drain and a second drain; the source including a comb-shaped first source arranged along the first direction and a comb-shaped second source arranged along a second direction different from the first direction and wherein the comb-shaped first source and the comb shaped second source are interconnected with each other; wherein the first drain and the second drain are comb-shaped, and comb teeth of the first drain and comb teeth of the first source are interdigitally disposed, and comb teeth of the second drain and comb teeth of the second source are interdigitally disposed;
    wherein, a comb handle connecting the comb teeth of the first source and a comb handle connecting the comb teeth of the second source are band-shaped electrodes respectively, extending along the second direction, and the comb handle of the first source is closer to the second pixel electrode than the first pixel electrode, and the comb handle of the second source is closer to the first pixel electrode than the second pixel electrode; and
  b) and a color film substrate disposed opposite to the array substrate.

15. The pixel structure of claim 2, wherein, the first source and the second source are connected by a common comb tooth.

16. The pixel structure of claim 15, wherein, a comb handle connecting the comb teeth of the first source and a comb handle connecting the comb teeth of the second source are band-shaped electrodes respectively extending along the second direction, and the comb handle of the first source is close to the second pixel electrode than the first electrode, and the comb handle of the second source is close to the first pixel electrode than the second electrode.

17. The pixel structure of claim 16, wherein, the comb handle of the first source and the comb handle of the second source are parallel.

18. The pixel structure of claim 15, wherein, the comb teeth of the first source and the comb teeth of the first drain are parallel to each other, and the comb teeth of the second source and the comb teeth of the second drain are parallel to each other.

19. The pixel structure of claim 15, wherein, distances between each of the comb teeth of the first source and two adjacent comb teeth of the first drain are equal, and distances between each of the comb teeth of the second source and two adjacent comb teeth of the second drain are equal.

20. The pixel structure of claim 15, wherein, the gate of the TFT is disposed above or below a layer where the source, the first drain and the second drain are located.

* * * * *